United States Patent
Lim et al.

(10) Patent No.: US 8,643,435 B2
(45) Date of Patent: Feb. 4, 2014

(54) APPARATUS AND METHOD FOR EXPANDING OPERATION REGION OF POWER AMPLIFIER

(71) Applicant: Samsung Electronics Co., Ltd., Suwon-si (KR)

(72) Inventors: Hyung-Sun Lim, Suwon-si (KR); Hee-Sang Noh, Yongin-si (KR); Young-Eil Kim, Suwon-si (KR); Bok-Ju Park, Suwon-si (KR); Sang-Hyun Baek, Suwon-si (KR); Ji-Seon Paek, Suwon-si (KR); Jun-Seok Yang, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/651,723

(22) Filed: Oct. 15, 2012

(65) Prior Publication Data

US 2013/0093513 A1  Apr. 18, 2013

(30) Foreign Application Priority Data

Oct. 14, 2011 (KR) .................. 10-2011-0105556

(51) Int. Cl.
*H03G 3/20* (2006.01)
(52) U.S. Cl.
USPC .............. 330/136; 330/297; 330/127; 330/51

(58) Field of Classification Search
USPC .................... 330/136, 297, 127, 51
See application file for complete search history.

(56) References Cited

U.S. PATENT DOCUMENTS

| | | | |
|---|---|---|---|
| 6,496,061 B1 * | 12/2002 | Bloom et al. | 330/51 |
| 7,068,096 B2 * | 6/2006 | Chu | 330/10 |
| 7,395,039 B2 * | 7/2008 | Akizuki et al. | 455/127.2 |
| 7,642,847 B2 * | 1/2010 | Cioffi et al. | 330/10 |
| 8,131,234 B2 * | 3/2012 | Liang et al. | 455/127.1 |
| 2007/0247253 A1 * | 10/2007 | Carey et al. | 332/112 |
| 2009/0191826 A1 | 7/2009 | Takinami et al. | |
| 2013/0229229 A1 * | 9/2013 | Park et al. | 330/127 |

* cited by examiner

*Primary Examiner* — Patricia Nguyen
(74) *Attorney, Agent, or Firm* — Jefferson IP Law, LLP

(57) ABSTRACT

An apparatus and a method for expanding an operation region in an envelope tracking power amplifier are provided. The apparatus for amplifying power of a transmission signal includes an amplitude component determination unit, a supply modulator, and a power amplify module. The amplitude component determination unit determines an amplitude component of a transmission signal. The supply modulator generates a supply voltage to be provided to the power amplify module depending on the amplitude component of the transmission signal determined by the amplitude component determination unit. The power amplify module amplifies power of the transmission signal depending on the supply voltage generated by the supply modulator.

19 Claims, 8 Drawing Sheets

APPARATUS AND METHOD FOR EXPANDING OPERATION REGION OF POWER AMPLIFIER

PRIORITY

This application claims the benefit under 35 U.S.C. §119 (a) of a Korean patent application filed on Oct. 14, 2011 in the Korean Intellectual Property Office and assigned Serial No. 10-2011-0105556, the entire disclosure of which is hereby incorporated by reference.

BACKGROUND OF THE INVENTION

1. Field of the Invention:

The present invention relates to an apparatus and a method for expanding an operation region of a power amplifier. More particularly, the present invention relates to an apparatus and a method for expanding an operation region of a supply modulated amplifier for amplifying power of an input signal using a supply voltage modulated with consideration of an amplitude component of an input signal.

2. Description of the Related Art:

With development of wireless communication technology, as the need for transmission of various multimedia signals increases rapidly and fast transmission in a mobile environment becomes necessary, interest in a 4th generation communication system is increasing rapidly.

The 4th generation communication system has a faster transmission speed, a wider bandwidth, and a larger Peak to Average Power Ratio (PAPR) than previous communication systems. Accordingly, the 4th generation communication system uses a supply modulated amplifier that amplifies an input signal using a supply voltage modulated with consideration of an amplitude component of the input signal. For example, the supply modulated amplifier uses an Envelop Elimination and Restoration (EER) amplification method, an Envelope Tracking amplification method, a polar amplification method, etc.

The supply modulated amplifier may obtain a high efficiency as illustrated in FIG. 1 by changing a supply voltage of a power amplifier depending on output power of the power amplifier to reduce power loss.

FIG. 1 illustrates a power amplify efficiency according to the related art.

Referring to FIG. 1, where a power amplifier amplifies power of a signal using a fixed supply voltage 100, a power amplify efficiency rapidly decreases in a high power level region. When a supply modulated amplifier is used in a high power level region 110, the supply modulated amplifier may raise a power amplify efficiency in the high power level region.

In case of using the ET amplify method, the supply modulated amplifier is configured as illustrated in FIG. 2.

FIG. 2 illustrates configuration of a supply modulated amplifier according to the related art.

Referring to FIG. 2, an ET amplify type supply modulated amplifier includes a baseband signal processor 200, an envelope generator 210, a supply modulator 220, a Radio Frequency (RF) processor 230, and a power amplify module 240.

The baseband signal processor 200 generates IQ data. The RF processor 230 converts IQ data provided from the baseband signal processor 200 to an RF signal and provides the same as an input signal of the power amplify module 240. The envelope generator 210 generates an envelope corresponding to IQ data provided from the baseband signal processor 200.

The supply modulator 220 determines a supply voltage of a High Power Amplifier (HPA) 242 forming the power amplify module 240 based on an envelope generated by the envelope generator 210.

The power amplify module 240 includes the HPA 242 for amplifying a signal of a high power level and a Low Power Amplifier (LPA) 244 for amplifying a signal of a low power level. The HPA 242 amplifies an input signal provided from the RF processor 230 using a supply voltage provided from the supply modulator 220 and outputs the amplified input signal. The LPA 244 amplifies an input signal provided from the RF processor 230 using fixed power and outputs the amplified input signal.

As described above, the power modulated amplifier can raise a power amplify efficiency of a high power level signal using the HPA 242 that uses a supply voltage modulated with consideration of an amplitude component of an input signal. However, since the LPA of the supply modulated amplifier uses fixed power, a power amplify efficiency of a low power level may be lowered. Accordingly, in the case where transmission of a low power level signal increases in a transmission terminal, power consumption may increase due to a low power amplify efficiency in the transmission terminal.

SUMMARY OF THE INVENTION

Aspects of the present invention are to address at least the above-mentioned problems and/or disadvantages and to provide at least the advantages described below. Accordingly, an aspect of the present invention is to provide an apparatus and a method for expanding an operation region of a power amplifier.

Another aspect of the present invention is to provide an apparatus and a method for expanding an operation region of a supply modulated amplifier.

Another aspect of the present invention is to provide an apparatus and a method for regulating a supply voltage of a power amplifier for amplifying a signal of a low power level in a supply modulated amplifier.

Another aspect of the present invention is to provide an apparatus and a method for regulating a supply voltage of a power amplifier for amplifying a signal of a high power level in a supply modulated amplifier.

Another aspect of the present invention is to provide an apparatus and a method for regulating supply voltages of a power amplifier for amplifying a signal of a high power level and a power amplifier for amplifying a signal of a low power level in a supply modulated amplifier.

Another aspect of the present invention is to provide an apparatus and a method for adaptively generating a supply voltage of a power amplifier depending on a power level of a signal for amplifying power in a supply modulator of a supply modulated amplifier.

In accordance with an aspect of the present invention, an apparatus for amplifying power of a transmission signal in a wireless communication system is provided. The apparatus includes an amplitude component determination unit for determining an amplitude component of a transmission signal, a supply modulator for generating a supply voltage based on the amplitude component of the transmission signal determined by the amplitude component determination unit, and a power amplify module for amplifying power of the transmission signal based on the supply voltage generated by the supply modulator, wherein when an output power of the transmission signal is greater than a reference power, the power amplify module controls a first power amplifier to amplify the power of the transmission signal based on the supply voltage generated by the supply modulator, and when the output power of the transmission signal is equal to or less than the reference power, the power amplify module controls a second power amplifier to amplify the power of the transmission signal based on the supply voltage generated by the supply modulator.

In accordance with another aspect of the present invention, a method for amplifying power of a transmission signal in a wireless communication system is provided. The method includes determining an amplitude component of a transmission signal, selecting one of a first power amplifier and a second power amplifier based on an output power of the transmission signal, generating a supply voltage of the selected power amplifier based on the amplitude component of the transmission signal, and amplifying the power of the transmission signal based on the supply voltage using the selected power amplifier.

Other aspects, advantages and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features and advantages of certain exemplary embodiments of the present invention will be more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

Figure 1:
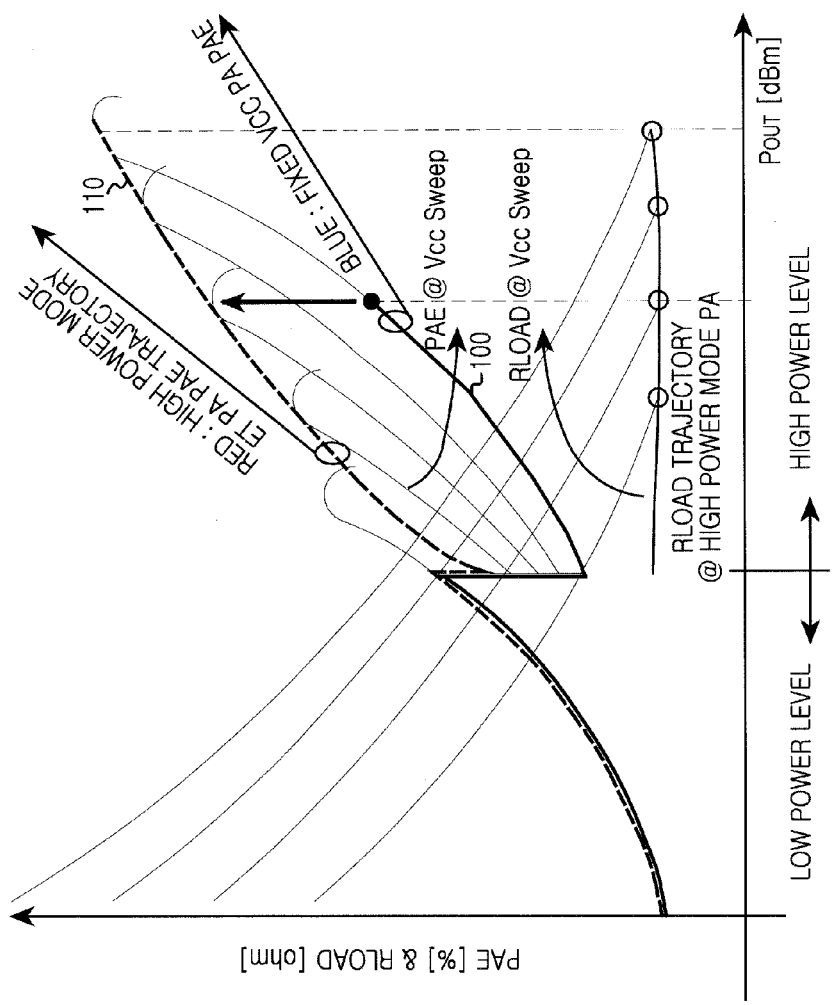
FIG. 1 is a graph illustrating a power amplify efficiency according to the related art.
Figure 2:
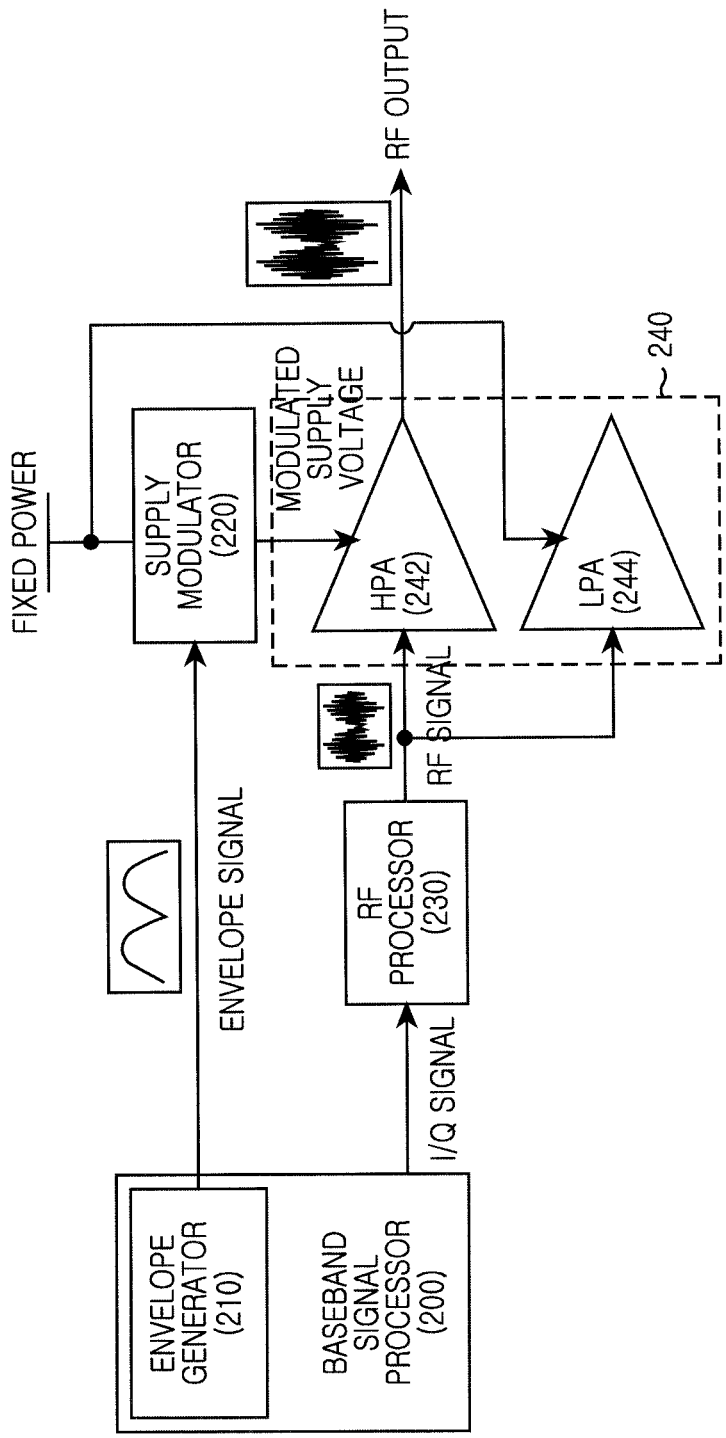
FIG. 2 is a block diagram illustrating configuration of a supply modulated amplifier according to the related art.

The following description with reference to the accompanying drawings is provided to assist in a comprehensive understanding of exemplary embodiments of the invention as defined by the claims and their equivalents. It includes various specific details to assist in that understanding, but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but are merely used by the inventor to enable a clear and consistent understanding of the invention. Accordingly, it should be apparent to those skilled in the art that the following description of exemplary embodiments of the present invention is provided for illustration purposes only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

The present invention relates to an apparatus and a method for expanding an operation region of a supply modulated amplifier for amplifying power of an input signal using a supply voltage modulated with consideration of an amplitude component of an input signal.

Exemplary embodiments of the present invention provide a technology for expanding an operation region of a supply modulated amplifier. The supply modulated amplifier is a power amplifier for amplifying an input signal using a supply voltage modulated with consideration of an amplitude component of the input signal. For example, the supply modulated amplifier may use an EER amplify method, an ET amplify method, a polar amplify method, and the like.

The following description assumes that the supply modulated amplifier amplifies power of a signal using the ET amplify method. However, the power of a signal may be amplified equally when the supply modulated amplifier uses an EER transmission method and a polar transmission method. In the following description, a supply modulated amplifier that uses the ET amplify method is referred to as an envelope tracking power amplifier.

In the following description, it is assumed that the envelope tracking power amplifier includes an HPA for amplifying a signal of a high power level and an LPA for amplifying a signal of a low power level. The envelope tracking power amplifier amplifies a signal whose output power is greater than a reference power using the HPA and amplifies a signal whose output power is less than the reference power using the LPA. The reference power denotes a reference for selecting a power amplifier for amplifying power of a signal. The reference power has a value in the range of 15 dBm-21 dBm.

A supply voltage of each power amplifier may be changed in the same manner even when the envelope tracking power amplifier includes a plurality of power amplifiers for amplifying signals of different power levels,.

Figure 3:
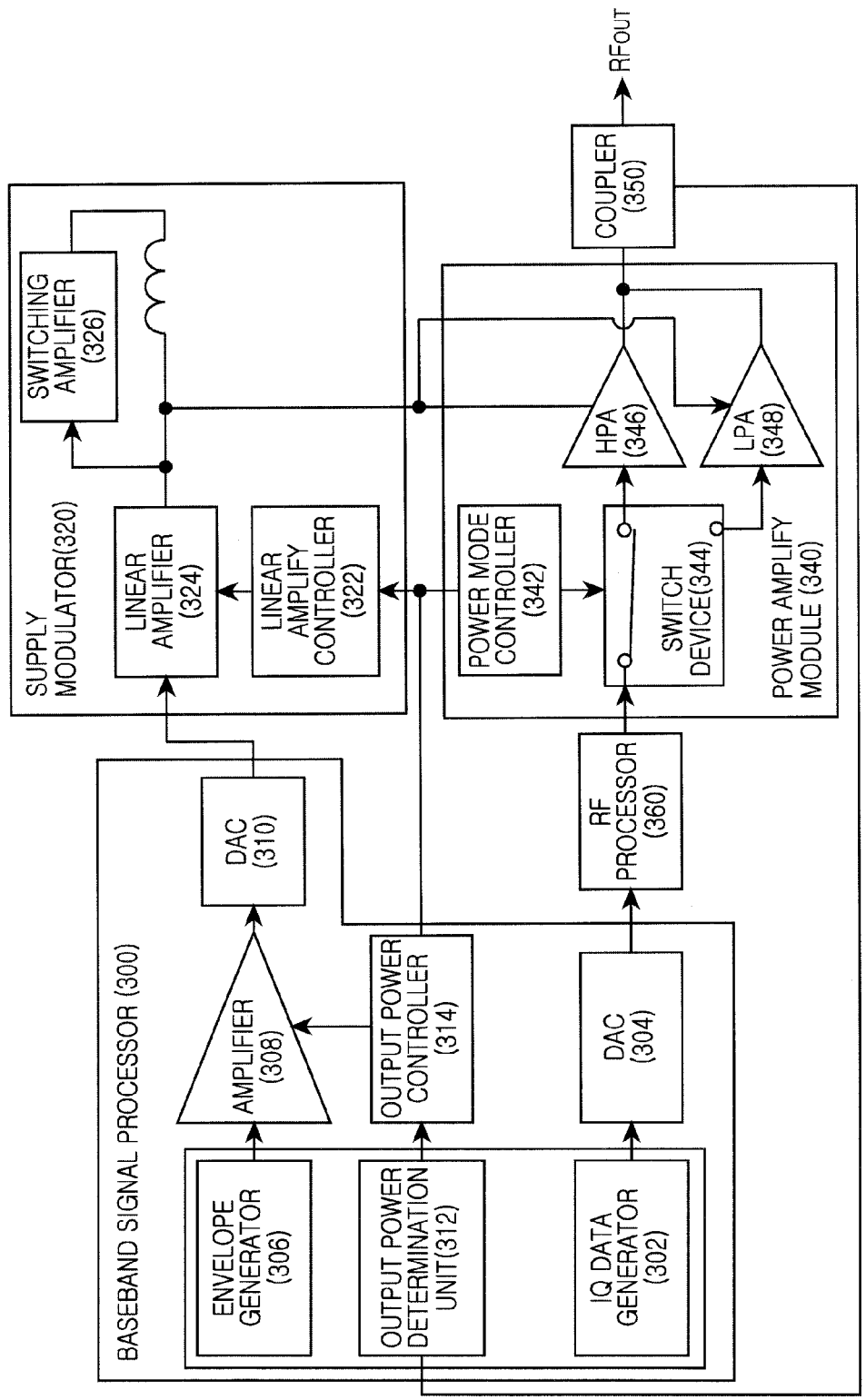
FIG. 3 is a block diagram illustrating an envelope tracking power amplifier according to an exemplary embodiment of the present invention.

To expand an operation region, the envelope tracking power amplifier is configured as illustrated in FIG. 3 to control supply voltages of an HPA and an LPA depending on an envelope.

FIG. 3 is a block diagram illustrating an envelope tracking power amplifier according to an exemplary embodiment of the present invention.

Referring to FIG. 3, the envelope tracking power amplifier includes a baseband signal processor 300, a supply modulator 320, a power amplify module 340, a coupler 350, and an RF processor 360.

The baseband signal processor 300 includes an IQ data generator 302, Digital/Analog Converters (DACs) 304 and 310, an envelope generator 306, an amplifier 308, an output power determination unit 312, and an output power controller 314.

The IQ data generator 302 generates IQ data of a baseband suitable for a communication standard. The DAC 304 converts IQ data provided from the IQ data generator 302 to an analog signal. The envelope generator 306 generates an envelope corresponding to IQ data provided from the IQ data generator 302.

The amplifier 308 amplifies an envelope generated by the envelope generator 306 depending on a gain control signal provided from the output power controller 314. The DAC 310 converts an amplified envelope signal provided from the amplifier 308 to an analog signal.

The output power determination unit 312 determines an output power level of a transmission signal to transmit with consideration of final output power provided from the coupler 350.

The output power controller 314 generates a gain control signal and a power mode control signal depending on an output power level of a transmission signal determined by the output power determination unit 312. The output power controller 314 may generate a gain control signal depending on an output power level of a transmission signal determined by the output power determination unit 312 and provides the same to the amplifier 308. The output power controller 314 may also provide a power mode control signal that depends on an output power level of a transmission signal determined by the output power determination unit 312 to the supply modulator 320 and the power amplify module 340. When the output power level of a transmission signal determined by the output power determination unit 312 is a high power level, the output power controller 314 generates a power mode control signal for controlling to amplify the transmission signal using the HPA 346. When the output power level of a transmission signal determined by the output power determination unit 312 is a low power level, the output power controller 314 generates a power mode control signal for controlling to amplify the transmission signal using the LPA 348.

The supply modulator 320 includes a linear amplify controller 322, a linear amplifier 324, and a switching amplifier 326.

Figure 4:
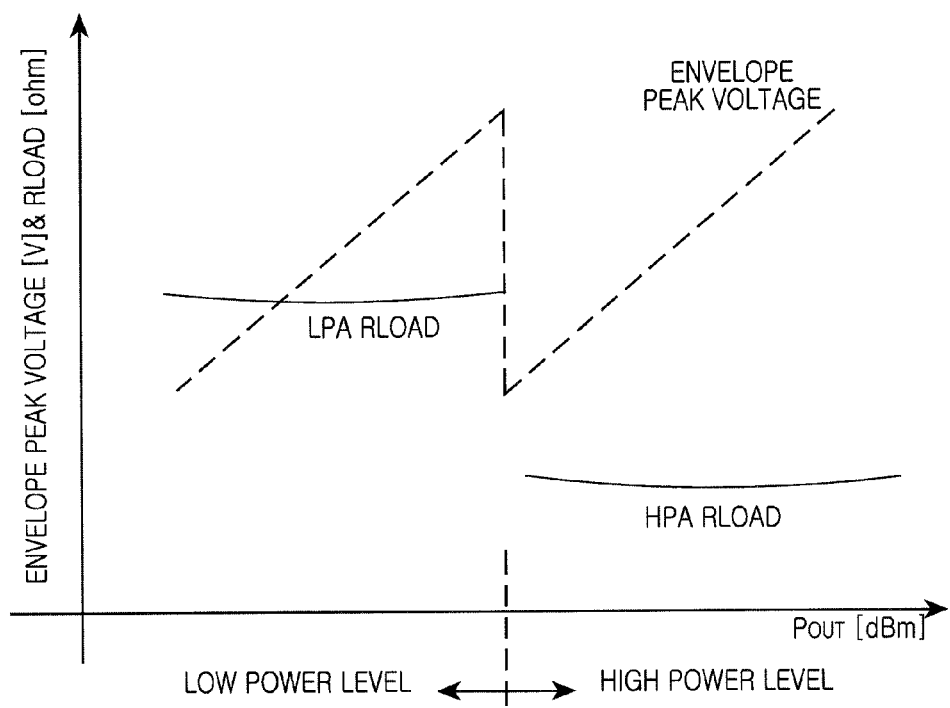
FIG. 4 is a graph illustrating a load of a power amplifier depending on a power level of an input signal of a power amplifier according to an exemplary embodiment of the present invention.

FIG. 4 is a graph illustrating a load of a power amplifier depending on a power level of an input signal of a power amplifier according to an exemplary embodiment of the present invention.

Referring to FIG. 4, the linear amplify controller 322 controls an operation mode of the linear amplifier 324 based on a power mode control signal provided from the output power controller 314. For example, when an amplifier used for amplifying a signal under control of the output power controller 314 is switched from the HPA 346 to the LPA 348, a load resistor of the supply modulator 320 becomes large as illustrated in FIG. 4.

When an amplifier used for amplifying a signal under control of the output power controller 314 is switched from the HPA 346 to the LPA 348, a gain of the power amplifier reduces. Accordingly, a supply voltage provided from the supply modulator 320 to the power amplify module 340 becomes large compared to a case of using the HPA 346 so that the power amplify module 340 may obtain a desired output power using the LPA 348. Since an output power of the HPA 346 and an output power of the LPA 348 should be the same, as a supply voltage provided from the supply modulator 320 to the power amplify module 340 becomes large, a supply current provided from the supply modulator 320 to the power amplify module 340 becomes small compared to a case of using the HPA 346. Accordingly, when an amplifier used for amplifying a signal is switched from the HPA 346 to the LPA 348, a load resistor of the supply modulator 320 becomes large as illustrated in FIG. 4.

When the load resistor of the supply modulator 320 changes as described above, an oscillation probability of the linear amplifier 324 designed with consideration of the HPA 346 is raised. Accordingly, when the power amplify module 340 amplifies a signal using the HPA 346, the linear amplify controller 322 controls the linear amplifier 324 to secure a phase margin according to the load resistor of the supply modulator 320 that depends on the HPA 346. When the power amplify module 340 amplifies a signal using the LPA 348 depending on a power mode control signal, the linear amplify controller 322 controls the linear amplifier 324 to secure a phase margin with consideration of the load resistor of the supply modulator 320 that depends on the LPA 348.

The linear amplifier 324 and the switching amplifier 326 determine a supply voltage of the power amplify module 340 depending on an amplified envelope signal provided from the DAC 310. For example, the linear amplifier 324 amplifies and outputs an amplified envelope signal provided from the DAC 310. The switching amplifier 326 supplies a current required for an output load of the supply modulator 320 based on a magnitude and polarity of a current supplied from the linear amplifier 324 to the output load. The linear amplifier 324 compensates for a shortage amount or an exceeding amount of a current supplied from the switching amplifier 326. The linear amplifier 324 includes an operational amplifier to perform a push-pull operation in a class-AB bias. The switching amplifier 326 may include a buck converter to perform a switching operation.

The RF processor 360 converts IQ data provided from the DAC 304 of the baseband signal processor 300 to an RF signal and outputs the same to the power amplify module 340.

The power amplify module 340 includes a power mode controller 342, a switch device 344, the HPA 346, and the LPA 348.

The power mode controller 342 controls to use the HPA 346 or the LPA 348 based on a power mode control signal provided from the output power controller 314. For example, when an output power level of a transmission signal is a high power level, the power mode controller 342 controls the switch device 344 so that an output signal of the RF processor 360 may be input to the HPA 346 based on a power mode control signal provided from the output power controller 314. When an output power level of a transmission signal is a low power level, the power mode controller 342 controls the switch device 344 so that an output signal of the RF processor 360 may be input to the LPA 348 based on a power mode control signal provided from the output power controller 314.

The HPA 346 amplifies an RF signal provided from the RF processor 360 via the switch device 344 using a supply voltage provided from the supply modulator 320 and outputs the same.

The LPA 348 amplifies an RF signal provided from the RF processor 360 via the switch device 344 using a supply voltage provided from the supply modulator 320 and outputs the same.

In the above exemplary embodiment of the present invention, the power amplify module 340 is configured to input an output signal of the RF processor 360 to the HPA 346 or the LPA 348 depending on an output power level of a transmission signal using the switch device 344.

According to another exemplary embodiment of the present invention, the power amplify module 340 may be configured to activate only one of the HPA 346 and the LPA 348 under control of the power mode controller 342 to amplify an RF signal provided from the RF processor 360. For example, when an output power level of a transmission signal is a high power level, the power mode controller 342 controls to activate the HPA 346 and amplify an RF signal provided from the RF processor 360, and the LPA 348 is deactivated. When an output power level of a transmission signal is a low power level, the power mode controller 342 controls to activate the LPA 348 and amplify an RF signal provided from the RF processor 360, and the HPA 346 is deactivated. In this case, the HPA 346 and the LPA 348 receive the same RF signal from the RF processor 360.

In the above exemplary embodiment of the present invention, the envelope tracking power amplifier generates an envelope corresponding to IQ data provided from the IQ data generator 302 using the envelope generator 306 of the baseband signal processor 300.

According to another exemplary embodiment of the present invention, the envelope tracking power amplifier may identify an envelope of IQ data transmitted from the baseband signal processor 300 to the RF processor 360.

As described above, the linear amplifier 324 secures a phase margin with consideration of a load resistor of the supply modulator 320 under control of the linear amplify controller 322. The linear amplifier 324 may be configured as illustrated in FIG. 5 or 6.

Figure 5:
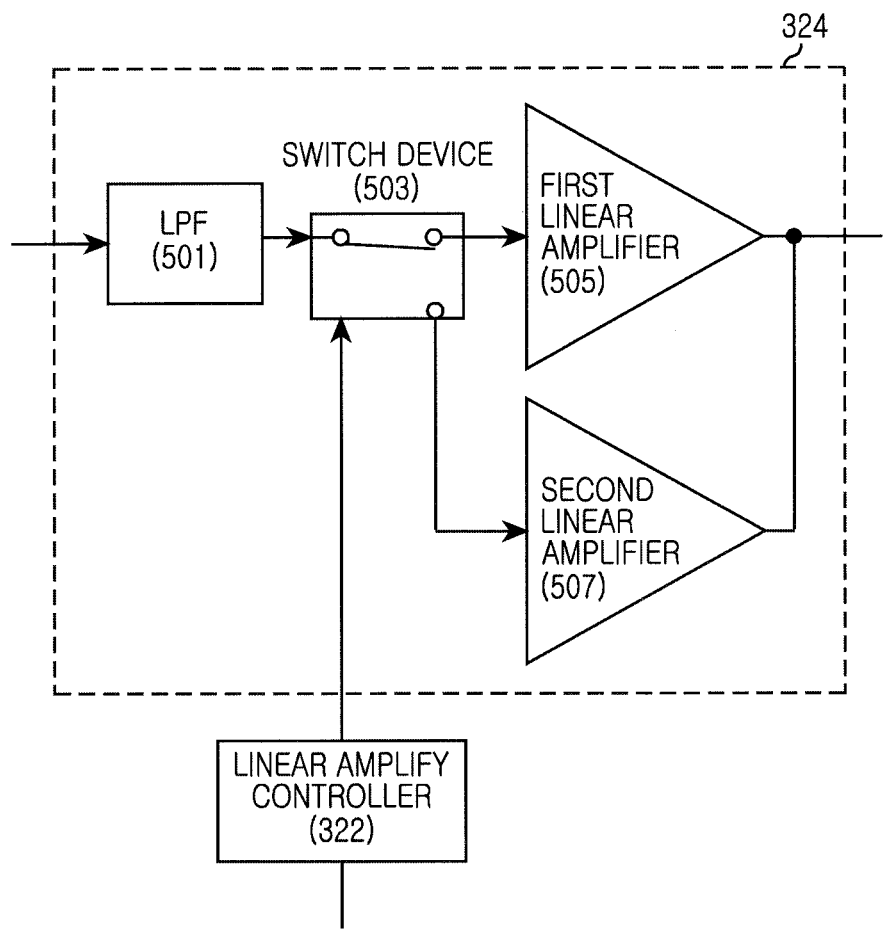
FIG. 5 is a block diagram illustrating a linear amplifier in a supply modulator according to an exemplary embodiment of the present invention.
Figure 6:
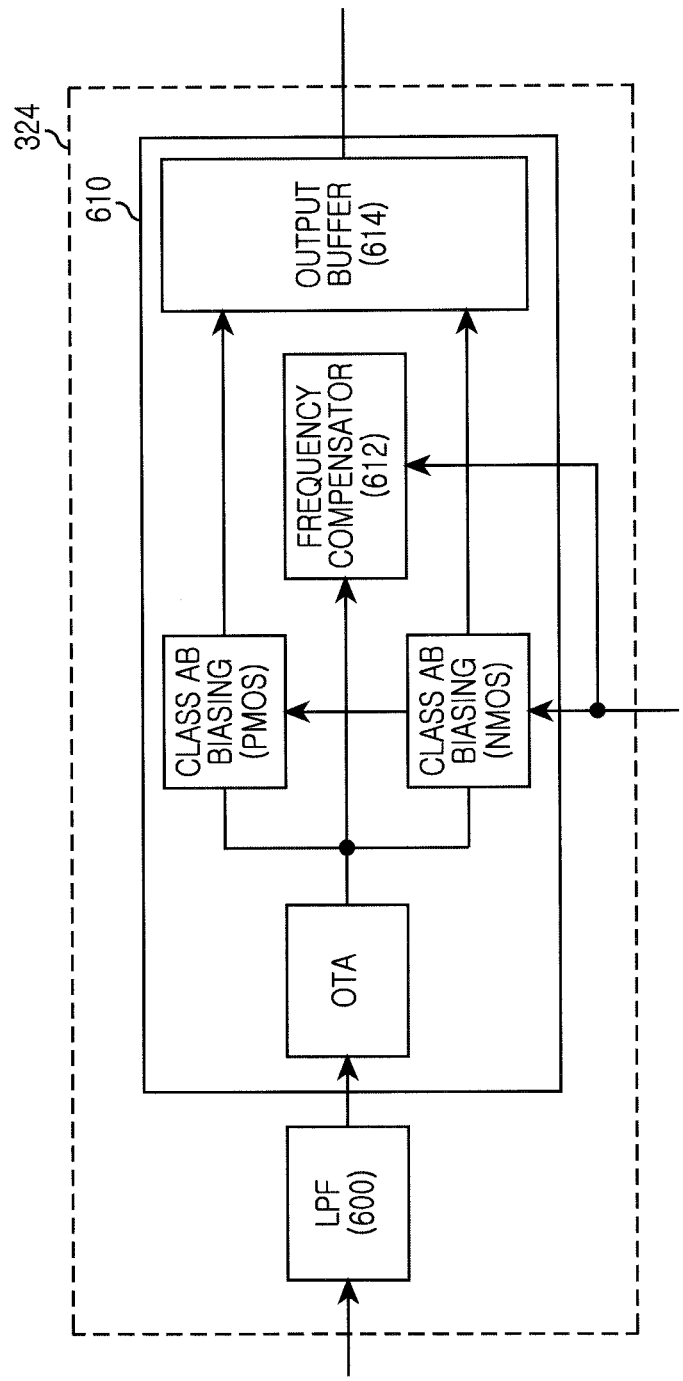
FIG. 6 is a block diagram illustrating a linear amplifier in a supply modulator according to another exemplary embodiment of the present invention.

FIG. 5 is a block diagram illustrating a linear amplifier in a supply modulator according to an exemplary embodiment of the present invention.

Referring to FIG. 5, the linear amplifier 324 includes a LPF 501, a switch device 503, a first linear amplifier 505, and a second linear amplifier 507.

The LPF 501 filters an image component of an envelope signal provided from the DAC 310 of the baseband signal processor 300.

The switch device 503 provides an output signal of the LPF 501 to the first linear amplifier 505 or the second linear amplifier 507. For example, when an output power level of a transmission signal is a high level, the switch device 503 provides an output signal of the LPF 501 to the first linear amplifier 505 designed according to a load resistor of the supply modulator 320 that depends on the HPA 346 under control of the linear amplify controller 322. When an output power level of a transmission signal is a low level, the switch device 503 provides an output signal of the LPF 501 to the second linear amplifier 507 designed according to a load resistor of the supply modulator 320 that depends on the LPA 346 under control of the linear amplify controller 322.

In the above exemplary embodiment of the present invention, the linear amplifier 324 is configured to input an output signal of the LPF 501 to the first linear amplifier 505 or the second linear amplifier 507 depending on an output power level of a transmission signal using the switch device 503.

According to another exemplary embodiment of the present invention, the linear amplifier 324 may be configured to activate only one of the first linear amplifier 505 and the second linear amplifier 507 under control of the linear amplify controller 322 to amplify an output signal of the LPF 501. For example, when an output power level of a transmission signal is a high power level, the linear amplify controller 322 controls to activate the first linear amplifier 505 and amplify an output signal of the LPF 501, and deactivate the second linear amplifier 507. When an output power level of a transmission signal is a low power level, the linear amplify controller 322 controls to activate the second linear amplifier 507 and amplify an output signal of the LPF 501, and deactivate the first linear amplifier 505. In this case, the first linear amplifier 505 and the second linear amplifier 507 receive the same output signal from the LPF 501.

FIG. 6 is a block diagram illustrating a linear amplifier in a supply modulator according to another exemplary embodiment of the present invention.

Referring to FIG. 6, the linear amplifier 324 includes an LPF 600 and a linear amplify module 610.

The LPF 600 filters an image component of an envelope signal provided from the DAC 310 of the baseband signal processor 300.

The linear amplify module 610 controls a phase margin of the linear amplify module 610 using a frequency compensator 612 under control of the linear amplify controller 322. For example, when an output power level of a transmission signal is a high level, the frequency compensator 612 controls a phase margin so that the linear amplify module 610 operates according to a load resistor of the supply modulator 320 that depends on the HPA 346 under control of the linear amplify controller 322. When an output power level of a transmission signal is a low level, the frequency compensator 612 controls a phase margin so that the linear amplify module 610 operates according to a load resistor of the supply modulator 320 that depends on the LPA 348 under control of the linear amplify controller 322.

When the linear amplify module 610 operates according to a load resistor of the supply modulator 320 that depends on the LPA 348, an output buffer 614 may reduce current drive capability. When the linear amplify module 610 operates according to a load resistor of the supply modulator 320 that depends on the LPA 348, an output power of the output buffer 614 is reduced. In this case, the output buffer 614 may raise an efficiency of the linear amplifier 324 by reducing the current drive capability.

A method for controlling supply voltages of the HPA and the LPA depending on an envelope in order to expand an operation region in an envelope tracking power amplifier is described below.

Figure 7:
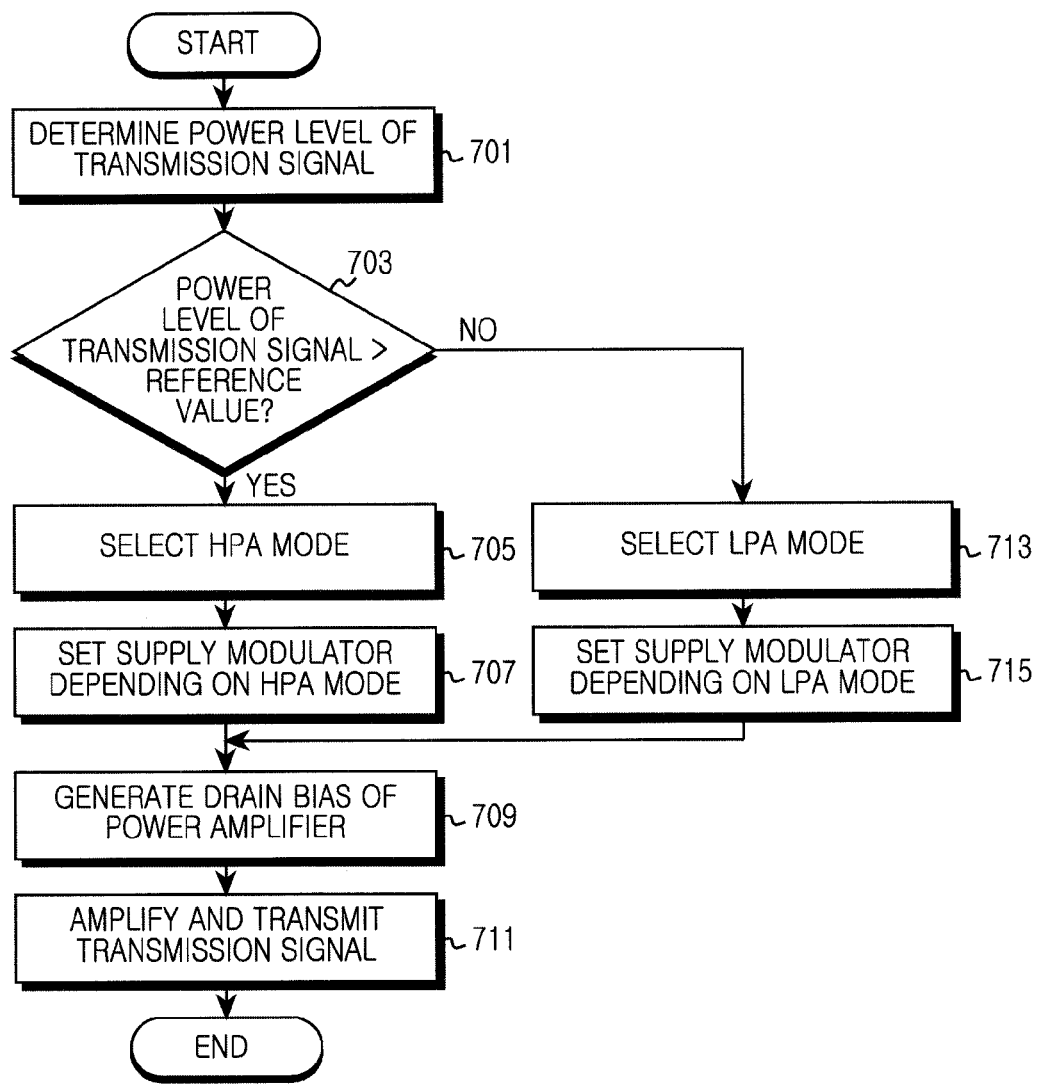
FIG. 7 is a flowchart illustrating a method for amplifying a signal according to an exemplary embodiment of the present invention.

FIG. 7 is a flowchart illustrating a method for amplifying a signal according to an exemplary embodiment of the present invention.

Referring to FIG. 7, an envelope tracking power amplifier determines an output power level of a transmission signal in step 701.

The envelope tracking power amplifier compares the output power level of the transmission signal with a reference value in step 703. The reference value which is compared with the output power level of the transmission signal represents a reference for determining whether the output power level of the transmission signal is a high power level or a low power level.

When the output power level of a transmission signal is greater than the reference value, the envelope tracking power amplifier recognizes that the output power level of the transmission signal is a high power level. Accordingly, the envelope tracking power amplifier selects an HPA mode in step 705. For example, in case of FIG. 3, the output power controller 314 of the envelope tracking power amplifier generates a power mode control signal for controlling to amplify a transmission signal using the HPA 346.

The envelope tracking power amplifier sets a supply modulator according to the HPA mode in step 707. For example, in case of FIG. 3, the supply modulator 320 controls the linear amplifier 324 to secure a phase margin with consideration of a load resistor of the supply modulator 320 that depends on the HPA 346.

After setting the supply modulator according to the HPA mode, the envelope tracking power amplifier generates a supply voltage of the HPA based on an envelope signal in step 709.

After generating the supply voltage of the HPA, the envelope tracking power amplifier amplifies and transmits a transmission signal in step 711 using the supply voltage of the HPA depending on the envelope signal. For example, in the case of FIG. 3, the HPA 346 amplifies and outputs an RF signal provided from the RF processor 360 using a supply voltage provided from the supply modulator 320.

When the output power level of a transmission signal is equal to or less than the reference value, the envelope tracking power amplifier recognizes that the output power level of the transmission signal is a low power level. Accordingly, the envelope tracking power amplifier selects an LPA mode in step 713. For example, in the case of FIG. 3, the output power controller 314 of the envelope tracking power amplifier generates a power mode control signal for controlling to amplify a transmission signal using the LPA 348.

The envelope tracking power amplifier sets the supply modulator according to the LPA mode in step 715. For example, in the case of FIG. 3, the supply modulator 320 controls the linear amplifier 324 to secure a phase margin with consideration of a load resistor of the supply modulator 320 that depends on the LPA 348.

After setting the supply modulator according to the LPA mode, the envelope tracking power amplifier generates a supply voltage of the LPA in step 709 based on an envelope signal.

After generating the supplying voltage of the LPA, the envelope tracking power amplifier amplifies and transmits a transmission signal in step 711 using the supply voltage of the LPA depending on an envelope signal. For example, in the case of FIG. 3, the LPA 348 amplifies and outputs an RF signal provided from the RF processor 360 using a supply voltage provided from the supply modulator 320.

After that, the envelope tracking power amplifier ends the present algorithm.

Figure 8:
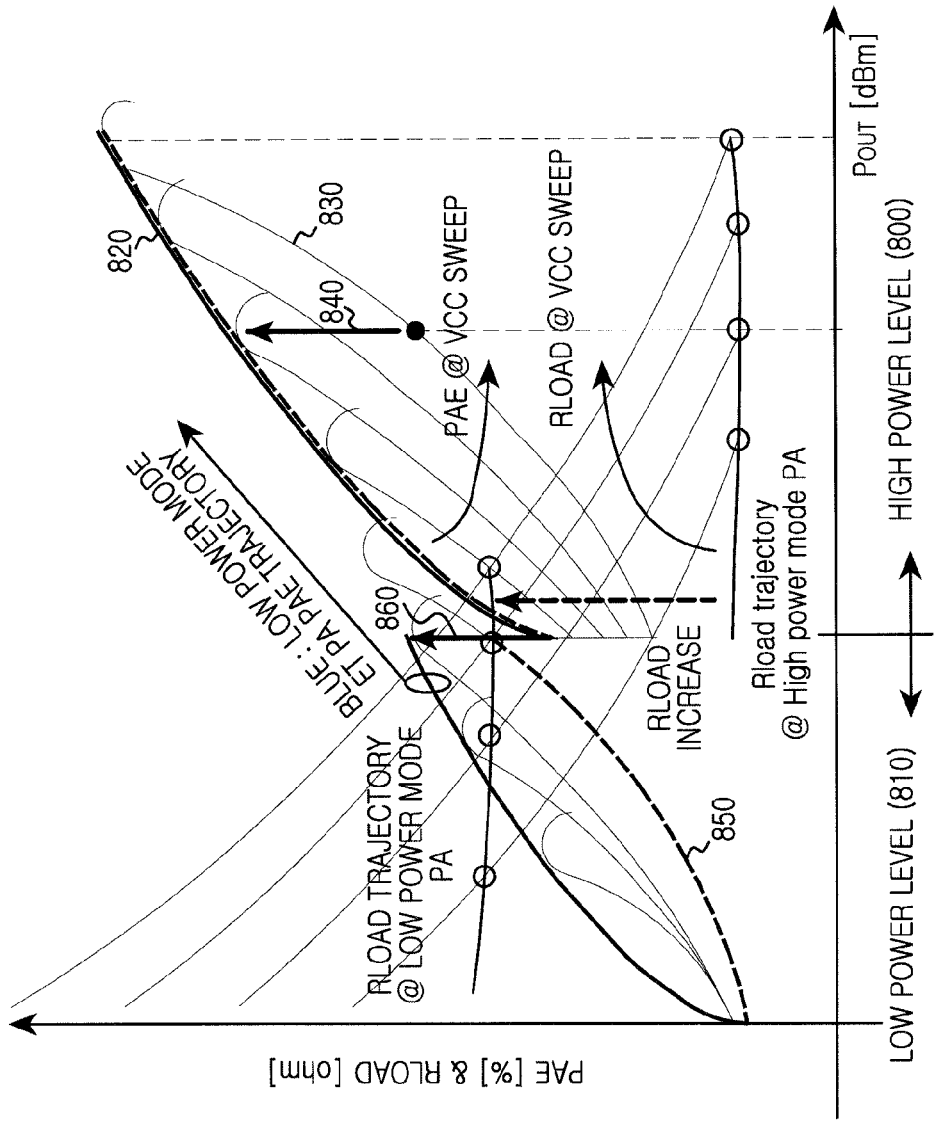
FIG. 8 is a performance change graph according to an exemplary embodiment of the present invention.

As described above, in the case where the envelope tracking power amplifier controls supply voltages of the HPA and the LPA depending on an envelope in order to secure an operation region, the envelope tracking power amplifier may improve an efficiency as illustrated in FIG. 8.

FIG. 8 is a performance change graph according to an exemplary embodiment of the present invention.

As illustrated, in case of regulating a supply voltage of an HPA 800 according to an envelope, an efficiency of a power amplifier 840 can be improved compared to a power amplifier 830 that uses a fixed supply voltage.

Also, in case of regulating a supply voltage 820 of an LPA 810 according to an envelope, an efficiency of a power amplifier 860 can be improved compared to a power amplifier 850 that uses a fixed supply voltage.

As described above, a supply modulated amplifier regulates a supply voltage of a power amplifier in a high power region and a lower region, so that an operation region of the supply modulated amplifier can be expanded and a power amplify efficiency of the power amplifier may be improved.

While the invention has been shown and described with reference to certain exemplary embodiments thereof, it will be understood by those skilled in the art that various changes in form and details may be made therein without departing from the spirit and scope of the invention as defined by the appended claims and their equivalents. Therefore, the scope of the present invention should not be limited to the above-described embodiments but should be determined by not only the appended claims but also the equivalents thereof.

What is claimed is:

1. An apparatus for amplifying power, the apparatus comprising:
    an amplitude component determination unit for determining an amplitude component of a transmission signal;
    a supply modulator for generating a supply voltage based on the amplitude component of the transmission signal; and
    a power amplify module for amplifying power of the transmission signal based on the supply voltage,
    wherein when an output power of the transmission signal is greater than a reference power, the power amplify module controls a first power amplifier to amplify the power of the transmission signal based on the supply voltage, and when the output power of the transmission signal is equal to or less than the reference power, the power amplify module controls a second power amplifier to amplify the power of the transmission signal based on the supply voltage.

2. The apparatus of claim 1, wherein the reference power is within a range of 15 dBm-21 dBm.

3. The apparatus of claim 1, further comprising:
    an output power controller for generating a control signal for comparing an output power of the transmission signal with the reference power to select one of the first power amplifier and the second power amplifier,
    wherein the power amplify module selects one of the first power amplifier and the second power amplifier based on the control signal.

4. The apparatus of claim 1, wherein the supply modulator secures a phase margin based on a load resistor of the power amplify module, and generates a supply voltage to be provided to the power amplify module based on the amplitude component of the transmission signal.

5. The apparatus of claim 4, wherein when the power amplify module amplifies power of the transmission signal via the first power amplifier, the supply modulator secures the phase margin based on a load resistor by the first power amplifier and generates a supply voltage to be provided to the first power amplifier based on the amplitude component of the transmission signal.

6. The apparatus of claim 4, wherein when the power amplify module amplifies power of the transmission signal via the second power amplifier, the supply modulator secures the phase margin based on a load resistor by the second power amplifier and generates a supply voltage to be provided to the second power amplifier based on the amplitude component of the transmission signal.

7. The apparatus of claim 1, wherein the supply modulator comprises a linear amplifier and a switching amplifier.

8. The apparatus of claim 7, wherein when a load resistor of the power amplify module changes, the linear amplifier changes frequency compensation information to secure a phase margin based on the load resistor of the power amplify module.

9. The apparatus of claim 7, wherein the linear amplifier comprises at least two linear amplifiers, and
    wherein one of the at least two linear amplifiers is selected according to the load resistor of the power amplify module.

10. The apparatus of claim 1, further comprising:
    an amplifier for amplifying the amplitude of the transmission signal determined by the amplitude component determination unit according to an output power of the transmission signal, wherein the supply modulator generates a supply voltage to be provided to the power amplify module based on the amplitude component of the transmission signal amplified by the amplifier.

11. A method for amplifying power of a transmission signal in a wireless communication system, the method comprising:
- determining an amplitude component of a transmission signal;
- selecting one of a first power amplifier and a second power amplifier based on an output power of the transmission signal;
- generating a supply voltage of the selected power amplifier based on the amplitude component of the transmission signal; and
- amplifying the power of the transmission signal based on the supply voltage using the selected power amplifier.

12. The method of claim 11, wherein the reference power comprises one of values included in a range of 15 dBm-21 dBm.

13. The method of claim 11, wherein the selecting of one of the first power amplifier and the second power amplifier comprises:
- when the output power of the transmission signal is greater than the reference power, selecting the first power amplifier; and
- when the output power of the transmission signal is equal to or less than the reference power, selecting the second power amplifier.

14. The method of claim 11, further comprising:
- after selecting the power amplifier, securing a phase margin of a supply modulator according to a load resistor by the power amplifier, wherein the generating of the supply voltage comprises generating, at the supply modulator, a supply voltage of the power amplifier according to the amplitude component of the transmission signal.

15. The method of claim 14, wherein the securing of the phase margin comprises:
- when selecting the first power amplifier, securing the phase margin of the supply modulator according to a load resistor by the first power amplifier.

16. The method of claim 14, wherein the securing of the phase margin comprises:
- when selecting the second power amplifier, securing the phase margin of the supply modulator according to a load resistor by the second power amplifier.

17. The method of claim 14, wherein the securing of the phase margin comprises:
- changing frequency compensation information of a linear amplifier of the supply moderator to secure a phase margin based on the load resistor of the power amplifier.

18. The method of claim 14, wherein the securing of the phase margin comprises:
- selecting one of at least two linear amplifiers included in the supply modulator according to the load resistor of the power amplifier.

19. The method of claim 11, wherein the generating of the supply voltage comprises:
- amplifying the amplitude component of the transmission signal according to the output power of the transmission signal; and
- generating the supply voltage of the power amplifier based on the amplified amplitude component of the transmission signal.

* * * * *